United States Patent [19]

Shinnaka

[11] Patent Number: 5,216,589
[45] Date of Patent: Jun. 1, 1993

[54] ADAPTIVE APPARATUS

[75] Inventor: Shinji Shinnaka, Yokohama, Japan

[73] Assignee: Canon Kabushiki Kaisha, Tokyo, Japan

[21] Appl. No.: 588,269

[22] Filed: Sep. 26, 1990

[30] Foreign Application Priority Data

Sep. 29, 1989 [JP] Japan .................................. 1-255522

[51] Int. Cl.⁵ .............................................. G05B 13/02
[52] U.S. Cl. ..................................... 364/148; 364/157
[58] Field of Search ............... 364/148, 157, 164, 165, 364/424.05; 318/310

[56] References Cited

U.S. PATENT DOCUMENTS 4,674,028  6/1987  Shioya et al. ........................ 364/148
4,881,172  11/1989  Miller .............................. 364/424.05

FOREIGN PATENT DOCUMENTS 2-196303  8/1990  Japan .................................. 364/157
2-196304  8/1990  Japan .................................. 364/157

OTHER PUBLICATIONS

"Block Implementation of Adaptive Digital Filters" by G. A. Clark et al., IEEE Transactions On Acoustics, Speech, And Signal Processing vol. 29, No. 3, Jun. 19, 1981, New York, pp. 744–752.

"A Self-Tuning Method for Smith Predictor and PID Controls", by A. Kaya et al., Advances In Instrumentation, vol. 39 No. 2, Oct. 1984, Pittsburgh pp. 843–855.

"Toward An Unified Theory Of Parameter Adaptive Control" by A. S. Morse, Proceedings of the 27th IEEE Conference on Decision and Control, Dec. 1988, Austin, Texas, pp. 745–750.

Primary Examiner—Jerry Smith
Assistant Examiner—Steven R. Garland
Attorney, Agent, or Firm—Fitzpatrick, Cella, Harper & Scinto

[57] ABSTRACT

An adaptive apparatus for adjusting a system parameter in an adaptive manner, wherein the parameter in the form of a vector is successively adjusted by using a vector error signal, a first adaptive gain signal in the form of a matrix corresponding to the vector error signal, a matrix signal and a second adaptive gain in the form of a matrix corresponding to the matrix signal.

18 Claims, 6 Drawing Sheets

ADAPTIVE APPARATUS

BACKGROUND OF THE INVENTION

1. Field of the Invention

The present invention relates to an adaptive apparatus which performs an adaptive adjustment of vector parameters of a system on a block basis.

2. Description of the Related Art

Nowadays, various adaptive systems are available which have functions for adjusting system parameters in an adaptive manner, such as adaptive control systems, adaptive identification systems, adaptive observation systems and adaptive equalization systems. In general, an adaptive system is a system in which system parameters designed to rule the system performance are adjusted in an adaptive manner in accordance with a variation in the characteristic of the adaptation object and/or the characteristics of the environmental conditions of the object, so as to maintain the operating conditions to optimize the performance of the system.

In order to effect an adaptive adjustment of a system parameter in response to a variation of characteristics, it is necessary that the rate or speed of the adaptive adjustment be higher than that of the change in the characteristic. To comply with such a demand, an adaptive method known as the "block adaptive method" has been used in which the signals used for adjusting parameters are processed on a block basis.

Thus, the principle of the block adaptive method is to process the signals on the block basis. In such a case, the signals are treated as a matrix signal.

In general, the following error equations are utilized to deduce a way of the adjustment of parameters for the block adaptive method.

$$\begin{aligned}\epsilon(k) &= Z^T(k)\psi(k) \\ &= Z^T(k)(\theta(k) - \theta) \\ &= Z^T(k)\theta(k) - s(k)\end{aligned} \quad (1)$$

$$\begin{aligned}e(k) &= Z^T(k)\psi(k - 1) \\ &= Z^T(k)(\theta(k - 1) - \theta) \\ &= Z^T(k)\theta(k - 1) - s(k)\end{aligned} \quad (2)$$

In these equations, k represents an integer variable to make functions, employing a factor of time as a discrete variable, using a predetermined sampling time $\epsilon(k)$ and e (k) respectively represent vector errors of $q \times 1$ matrixes, Z(k) represents a matrix signal of an available $p \times q$ matrix, $Z^T(k)$ is a matrix signal of the transposed matrix, $\theta$ represents a vector parameter of a desirable bounded unknown $p \times 1$ matrix (vector), $\theta$ represents a system parameter of a $p \times 1$ matrix (vector) as an adaptive estimate of $\theta$, $\Psi(k)$ represents the parameter error of a $p \times 1$ represented by $\Psi(k) = \theta(k) - \theta$, and s(k) represents a vector signal of an available $q \times 1$ matrix (vector) represented by $s(k) = Z^T(k)\Psi$.

In an adaptive system, it is necessary that the vector parameter $\theta(k)$ is adjusted to satisfy the conditions of the following formulae (3) to (6).

$$\lim_{k \to \infty} \epsilon(k) = 0 \quad (3)$$

$$\|\theta(k)\| < \infty \quad (4)$$

$$\lim_{k \to \infty} (\theta(k) - \theta(k - 1)) = 0 \quad (5)$$

$$\lim_{k \to \infty} \theta(k) = 0 \quad (6)$$

The formula (3) shows that the vector error $\epsilon(k)$ is zero at the limit. The formula (4) shows that the system parameter $\theta(k)$ is always bounded. The formula (5) represents that the amount of correction of the system parameter is 0 at the limit. The formula (6) shows a stricter condition than the formula (5), and means that the adaptively adjusted parameter $\theta(k)$ takes the desirable value $\theta$ at the limit.

For the purpose of executing the above-described adjustment, the known adaptive apparatus employ an adjusting method which utilizes the following formula (7) as proposed by G. A. Clark, S. K. Mitra and S. R. Parker: Block implementation of Adaptive Digital Filter, IEEE Trans. Acoustics, Speech and Signal Processing, Vol. ASSP-29, No. 3, pp. 744–752 (1981).

$$\theta(k) = \theta(k-1) - \gamma Z(k) e(k) \quad (7)$$

In this formula, $\gamma$ represents an adaptive gain of a fixed scalar referred to as "step size". The formula (7) successively adjusts the system parameter $\theta(k)$ by using the adaptive gain $\gamma$, matrix signal Z(k) and the vector error e(k).

In the known method in which the system parameter $\theta(k)$ is adaptively adjusted in accordance with the formula (7), the performance of the adaptive adjustment is controlled by the adaptive gain $\gamma$ alone, once the matrix signal Z(k) and the vector error e(k) have become available.

In this case, however, the convergence of the system parameter $\theta(k)$ is impaired due to the fact that only one adaptive gain, which is a fixed scalar, is used, Thus, the conditions shown by the formulae (3) to (6) can not always be obtained and may fail particularly when the adaptive gain $\gamma$ is large. In order that the conditions of the formulae (3) to (6) are secured, it is generally necessary to reduce the adaptive gain $\gamma$ considerably. In such a case, however, the speed of convergence of the system parameter $\theta(k)$ is seriously decreased, as will be clearly seen from the formula (7).

Conversely, when the adaptive gain is increased to attain a higher convergence speed, the stability of the convergence is often impaired, resulting in a divergence of the system parameter in the worst case.

These problems are ascribed to the fact that a single fixed scalar is used as the adaptive gain.

The basic concept of the adaptive system is to determine the system structure such that the system performance is governed by system parameters, and to adjust the system parameters in an adaptive manner so as to maximize the performance of the system. The performance of the adaptive system, therefore, largely depends on the adaptive apparatus which adjusts the system parameters in adaptive manner. Thus, it has been impossible to construct an adaptive system having superior performance, with the known adaptive apparatus which suffers from the aforementioned problems.

SUMMARY OF THE INVENTION

Accordingly, an object of the present invention is to provide an adaptive apparatus which can adjust the system parameters with a high degree of precision.

Another object of the present invention is to provide an adaptive apparatus in which signals are processed on a block basis so as to realize a high-speed adjustment of a system parameter.

Still another object of the present invention is to provide an adaptive apparatus for adjusting a system parameter in an adaptive manner, wherein two gains are used and processing is conducted in the form of a matrix to realize a high degree of freedom of the gains.

According to one aspect, the present invention which achieves these objectives relates to an adaptive apparatus for adjusting a system parameter in an adaptive manner, comprising: input means for inputting a signal; adaptive processing means for performing an adaptive processing of the signal inputted by the input means; output means for outputting an output signal obtained through the processing performed by the adaptive processing means; first signal generating means for forming a matrix signal from the input signal and the output signal; second signal generating means for forming a vector signal from the input signal and the output signal; deriving means for deriving a vector error signal from the matrix signal, the vector signal and an estimate of the system parameter; and adjusting means for adjusting the system parameter in the form of a vector, by using the vector error signal, a first adaptive gain in the form of matrix corresponding to the vector error signal, the matrix signal, and a second adaptive gain in the form of a matrix corresponding to the matrix signal.

Other objectives and advantages, besides those discussed above, shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

DESCRIPTION OF THE PREFERRED EMBODIMENTS

Figure 1:
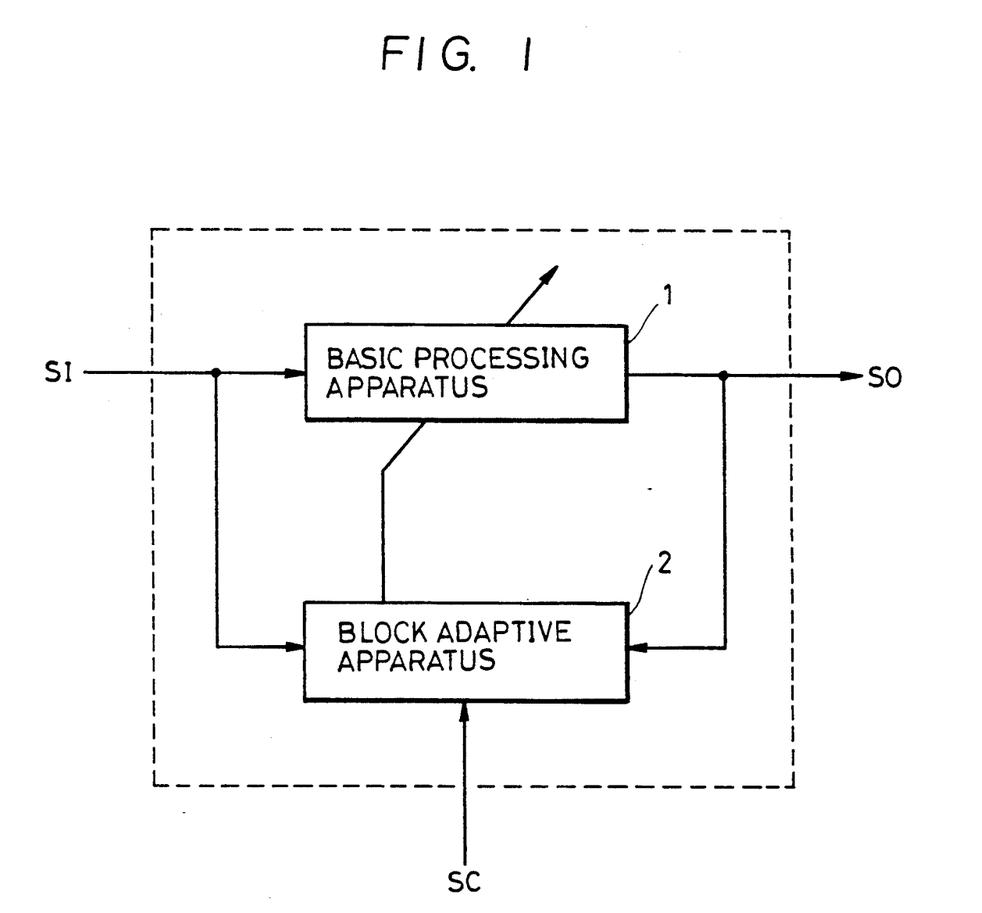
FIG. 1 is a basic block diagram showing the basic structure of an adaptive system incorporating an adaptive apparatus embodying the present invention.

FIG. 1 shows an adaptive system which makes use of an adaptive apparatus embodying the present invention. The adaptive system has a basic processing apparatus 1 which receives externally given input signals and processes the signals in an adaptive manner, and a block adaptive apparatus 2 which conducts an adaptive adjustment of a system parameter used in the basic processing apparatus 1, upon receipt of input and output signals SI and SO, respectively, of the basic processing apparatus 1 and an externally given performance command signal SC.

Figure 2:
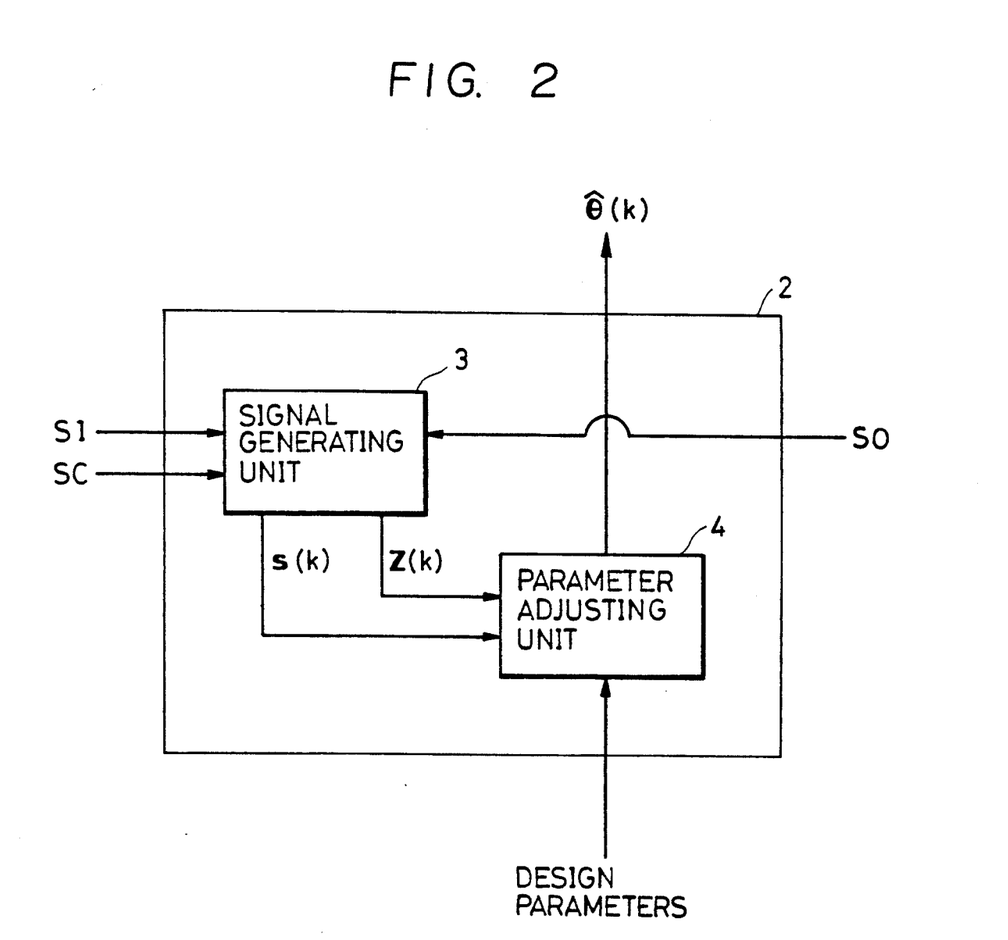
FIG. 2 is a block diagram of an embodiment of the adaptive apparatus in accordance with the present invention.

Referring to FIG. 2 which is a block diagram of the block adaptive apparatus 2 used in the system shown in FIG. 1, the block adaptive apparatus 2 includes a signal generating unit 3 and a parameter adjusting unit 4. The signal generating unit 3 receives an externally given input signal SI, an output signal SO and an externally given command signal SC and, upon receipt of these signals, generates a matrix signal Z(k) and a vector signal s(k). On the other hand, the parameter adjusting unit 4 conducts an adaptive adjustment of a system parameter successively, upon receipt of the matrix signal Z(k) and the vector signal s(k), as well as a set parameter including an initial value. The parameter adjusting unit 4 performs two processes in the form of a software or a hardware or a combination of a software and a hardware. One of the processes determines the vector error e(k) in accordance with the formula (2), while the other is the following process having $\Gamma(k-1)$ which is a matrix-form adaptive gain for the matrix signal Z(k) and e(k) which is a matrix-form adaptive gain for the vector error $\Gamma e(k)$. The adaptive gains $\Gamma(k-1)$ and $\Gamma e(k)$ will be referred to as "signal matrix gain" and "error matrix gain", respectively.

$$\theta(k) = \theta(k-1) - \Gamma(k-1) Z(k) \Gamma_e(k) e(k) \quad (8)$$

Formula (8) conducts a successive adaptive adjustment of the system parameter $\theta(k)$. Namely, the system parameter at a moment k ($\theta(k)$) is obtained by adding a correction amount $(-\Gamma(k-1)Z(k)\Gamma_e(k)e(k))$ to the system parameter at a moment $k-1$ ($\theta(k-1)$). The correction amount is formed by multiplying the $q \times 1$ vector error e(k) with a $q \times q$ error matrix gain $\Gamma e(k)$, multiplying the product $\Gamma e(k)e(k)$ with a $p \times q$ matrix signal Z(k) and then multiplying the product $Z(k)\Gamma e(k)e(k)$ with a $p \times p$ signal matrix gain $\Gamma(k-1)$.

Figure 3:
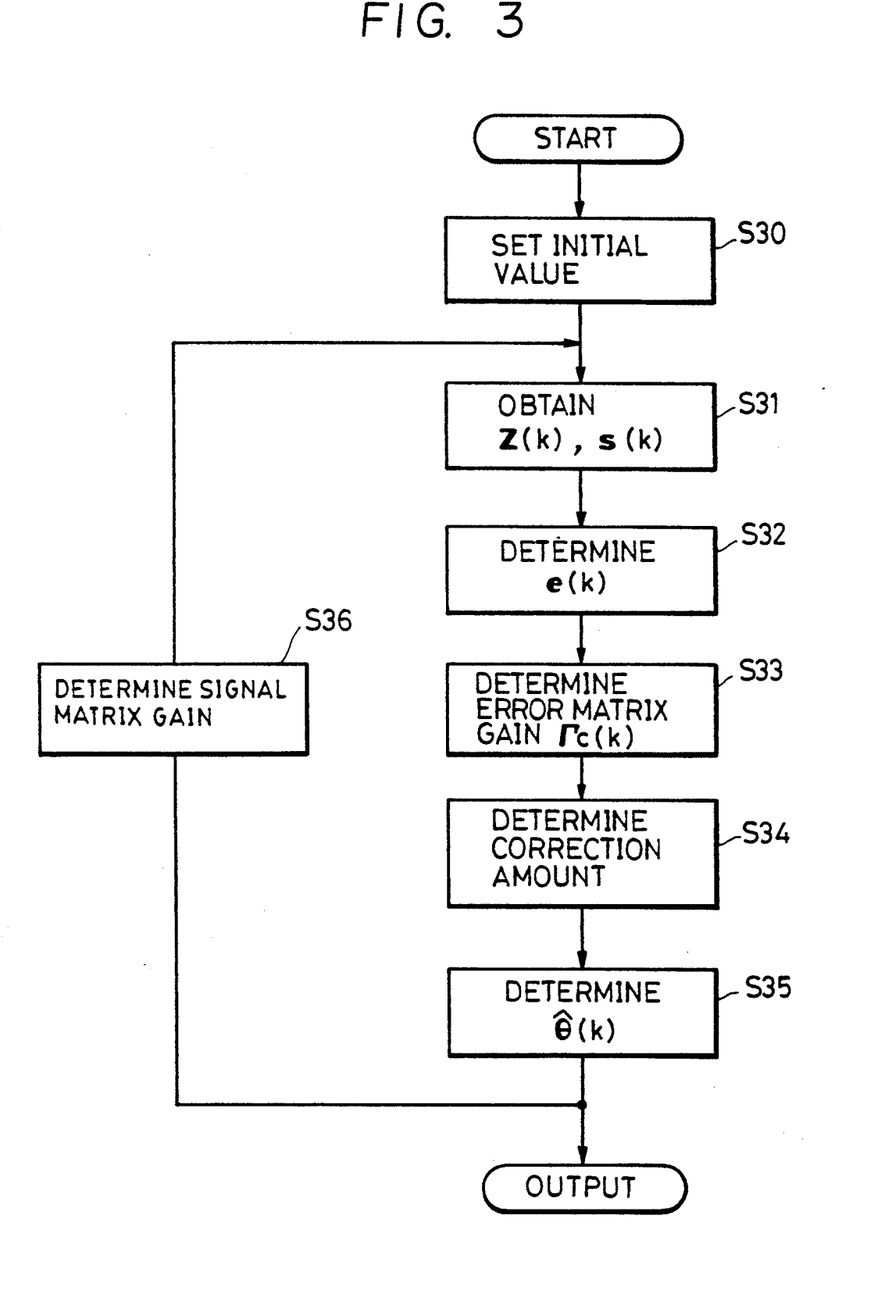
FIGS. 3 to 6 are flow charts illustrative of processes for adjusting parameters.

The above-described relationships will be described in more detail with specific reference to FIG. 3.

In Step S 30, values of $\theta(-1)$ and $\Gamma(-1)$ are determined as initial values, and usable signals Z(k) and s(k) are determined in Step S 31. In Step S 32, the vector error e(k) is determined in accordance with the formula (2) by using the signal s(k) obtained in Step S 31, a signal $Z^T(k)$ transposed from Z(k) and the system parameter $\theta(k-1)$ of the preceding moment $(k-1)$. Step S 33 determines the error matrix gain $\Gamma e(k)$. In Step S 34, the correction amount $(-\Gamma(k-1)Z(k)\Gamma e(k)e(k))$ is determined using the signal matrix gain $F(k-1)$ of the preceding moment, the signal Z(k) obtained in Step S 31, the vector error e(k) obtained in Step S 32 and the error matrix gain $\Gamma e(k)$ obtained in Step S 33. In Step S 35, the correction amount determined in Step S 34 is added to the system parameter $\theta(k-1)$ of the preceding moment in accordance with the formula (8) so that $\theta(k)$ is determined and output. In Step S 36, a signal matrix gain necessary for the next parameter adjustment is determined.

Thus, the apparatus of this embodiment is characterized by the use of two matrix-form adaptive gains, i.e., the signal matrix gain $\Gamma(k)$ and the error matrix gain $\Gamma_e(k)$, for the purpose of adaptive adjustment of the system parameter.

A detailed description will be given of these two adaptive gains.

The signal matrix gain $\Gamma(k)$ is determined in accordance with the following relationship.

$$\Gamma(k) = (1/\lambda(k))[\Gamma(k-1) - \Gamma(k-1)Z(k) \qquad (9)$$
$$\cdot (\lambda(k)\Lambda^{-1}(k) + Z^T(k)\Gamma(k-1)Z(k))^{-1}$$
$$\cdot Z^T(k)\Gamma(k-1)]$$

In this case, the initial value $\Gamma(-1)$ is selected as follows.

$$\Gamma(-1) = \Gamma^T(-1) > 0 \qquad (10)$$

$$\Gamma^{-1}(-1) = \Gamma^{-T}(-1) > 0$$

wherein, representing a symmetric matrix by A, A>0 is a positive definite matrix.

The formula (9) newly employs a scalar parameter $\lambda(k)$ and a matrix parameter $\Lambda(k)$. These parameters are selectable by the designer so as to meet the following conditions.

$$0 < \lambda(k) \leq 1$$

$$\Lambda(k) = \Lambda^T(k) \qquad (11)$$

$$9 \leq \Lambda(k) < m\ I; m < \infty$$

The design parameters $\lambda(k)$ and $\Lambda(k)$ introduced for the purpose of setting the signal matrix gain are determined in accordance with the characteristics of the system, as well the use of the system, in order to enable the adaptive apparatus and the adaptive system to fully exert their performances. Thus, the signal matrix gain $\Gamma(k)$ has a sufficiently large flexibility and, therefore, may be fixed or varied in relation to time.

For instance, it is assumed that the design parameters are determined as the following formula (12).

$$\lambda(k) = 1$$

$$\Lambda(k) = \Lambda^T(k) = 0 \qquad (12)$$

In this case, signal matrix gain $\Gamma(k)$ is determined by substituting the formula (12) to the formula (9) as follows.

$$\Gamma(k) = \Gamma(k-1)$$

therefore, $$\Gamma(k) = \Gamma(-1)$$

Thus, the signal matrix gain $\Gamma(k)$ is fixed in this case. $\Gamma(-1)$ needs only to be a positive constant matrix which satisfies the condition of the formula (10) so that it may be determined to be, for example, a positive definite diagonal matrix. In an alternative, in a specific case, $\Gamma y(-1)$ maybe determined by multiplying a unit matrix with positive scalar.

It is assumed that the design parameters $\lambda(k)$ and $\Lambda(k)$ are determined to meet the conditions of the following formula (13).

$$\lambda(k) \neq 1$$

$$\Lambda(k) = \Lambda^T(k) \neq 0 \qquad (13)$$

In this case, the signal matrix gain $\Gamma(k)$ varies in relation to time, following the conditions of the formula (9). The design parameters $\lambda(k)$ and $\Lambda(k)$ are determined in accordance with the characteristics of the system, as well as purpose of use of the system, in order to enable the adaptive apparatus and the adaptive system to fully exert their performances, also when the signal gain is varied in relation to time.

In this case, various methods are usable for the purpose of determining the design parameters $\lambda(k)$ and $\Lambda(k)$. For instance, it is possible to use various methods such as a degressing gain method, fixed-forgetting gain method, constant-trace gain method, upper-limit trace gain method, lower-limit trace gain method and both-limit trace gain method, which are ordinarily used for the processing of a p ×q matrix signal Z(k) particularly on condition of q=1.

The condition of the signal gain shown in the formula (9) also can be expressed as follows:

$$\Gamma^{-1}(k) = \lambda(k)\Gamma^{-1}(k-1) + Z(k)\Lambda(k)Z^T(k) \qquad (14)$$
$$= \prod_{i=0}^{k} \lambda(i)\Gamma^{-1}(-1)$$
$$+ \sum_{i=0}^{k} \prod_{j=i+1}^{k} \lambda(j)Z(i)\Lambda(i)Z^T(i)$$

As will be seen from the formula (14), when the design parameter $\Lambda(k)$ is determined not to be zero, the inverse matrix of the signal matrix gain $\Gamma(k)$ is an adaptive correlation matrix of the matrix signal Z(k).

The error matrix gain $\Gamma e(k)$ appearing in the formula (8) is determined to meet the following condition.

$$\Gamma_e(k) = \Gamma_e^T(k) \cdot (2\Lambda^{-1}(k) + Z^T(k)\Gamma(k-1)Z(k))^{-1} \qquad (15)$$
$$< \Gamma_e(k)$$
$$< (Z^T(k)\Gamma(k-1)Z(k)) - 1$$
$$\cdot (4\Lambda^{-1}(k) + Z^T(k)\Gamma(k-1)Z(k))$$
$$\cdot (2\Lambda^{-1}(k) + Z^T(k)\Gamma(k-1)Z(k))^{-1}$$

Various types of gain $\Gamma e(k)$ can meet the condition of the formula (15). As will be seen from the formula (15), the following types of gain $\Gamma e(k)$ satisfy this condition.

(1) $\Gamma e(k)$ is varied in relation to time.
(2) $\Gamma e(k)$ is varied in an adaptive manner in accordance with the matrix signal Z(k) and the signal matrix gain $\Gamma(k-1)$.
(3) $\Gamma e(k)$ is determined as a diagonal matrix.
(4) As a special case of (3) above, $\Gamma e(k)$ is determined as a product of a unit matrix and a scalar.

As will be understood from the foregoing description, the formula (8) having the signal matrix gain $\Gamma(k-1)$ and the error matrix gain $\Gamma e(k)$ possesses a sufficiently large flexibility and, by using this flexibility, it is possible to conduct a parameter adjustment optimum for the adaptive system.

It is assumed here that the error matrix gain $\Gamma e(k)$ is determined as follow.

$$\Gamma_e(k) = (\lambda(k)\Lambda^{-1}(k) + Z^T(k)\Gamma(k-1)Z(k))^{-1} \qquad (16)$$

The condition of formula (16) satisfies the condition of the formula (15). In this case, the formula (8) can be expressed as follows.

$$\theta(k) = \theta(k-1) - \Gamma(k-1)Z(k) \qquad (17)$$
$$\cdot \, (\lambda(k)\Lambda^{-1}(k)$$
$$+ \, Z^T(k)\Gamma(k-1)Z(k))^{-1}e(k)$$

Then, the formulae (9) to (11) are rewritten as follows.

$$\Gamma(k) = (1/\lambda(k))[\Gamma(k-1) - \Gamma(k-1)Z(k) \qquad (18)$$
$$\cdot \, (\lambda(k)\Lambda^{-1}(k) + Z^T(k)\Gamma(k-1)Z(k))^{-1}$$
$$\cdot \, Z^T(k)\Gamma(k-1)]$$

$$\Gamma(-1) > 0, \; \Gamma^{-1}(-1) > 0 \qquad (19)$$

$$0 > \lambda(k) \leq 1$$

$$0 \leq \Lambda(k) < m\,I\,;\, m < \infty \qquad (20)$$

The formulae (17) to (20) adjust the parameter $\theta(k)$ in such a manner as to minimize the following estimation function $J(\theta(k))$, thus exhibiting superior converging characteristic.

$$J(\theta(k)) = \sum_{i=0}^{k}\left[\sum_{j=i+1}^{k} (j)(\theta(k) - \theta)^T Z(i)\Lambda(i)Z^T(i)(\theta(k) - \theta)\right] \qquad (21)$$

Figure 4:
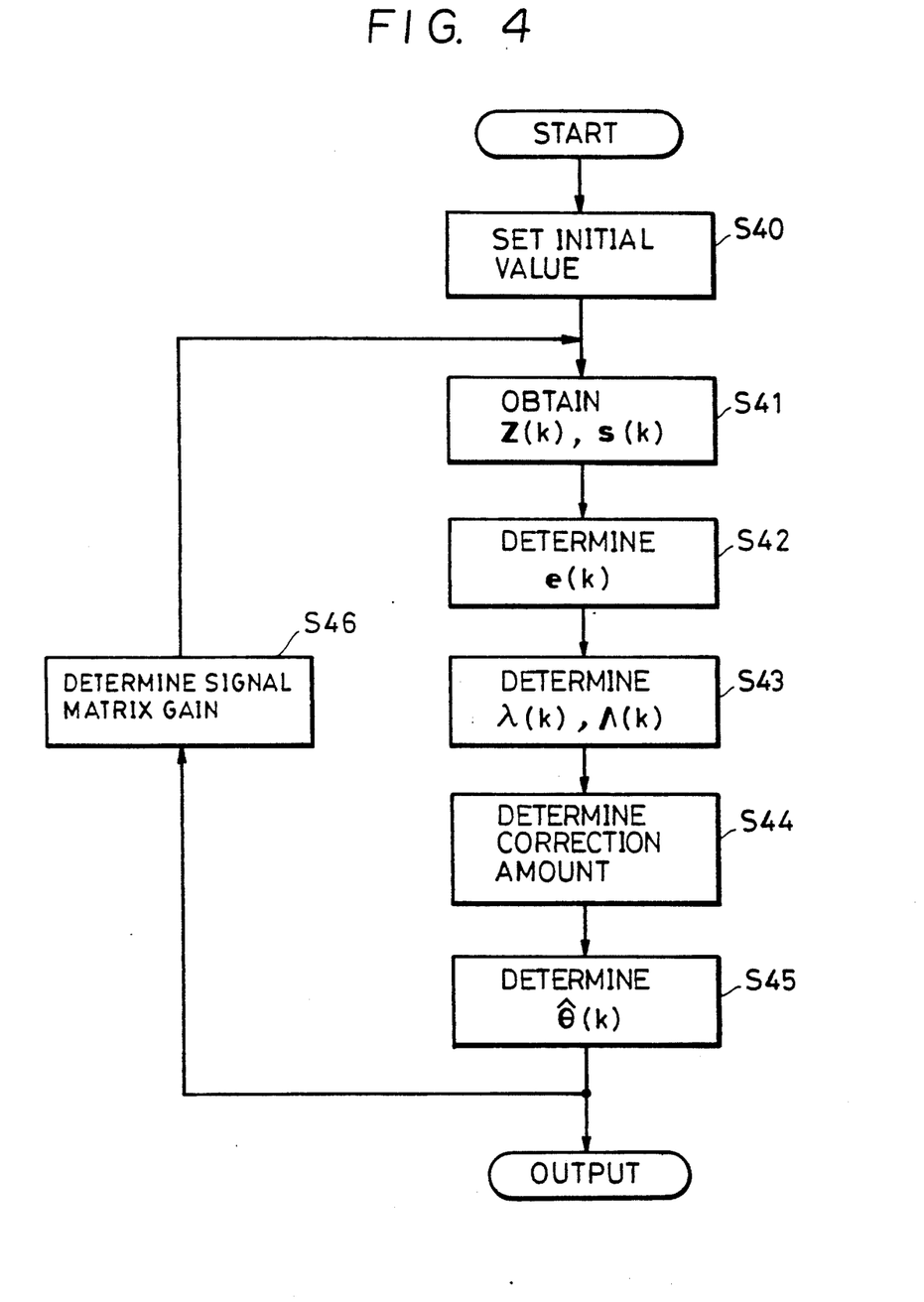

FIG. 4 shows a flow chart of a process executed in accordance with the formulae (17) to (20).

Steps S 40 to S 46 are practical forms of the basic processing operation executed in Steps S 30 to S 36 of the process explained before in connection with FIG. 3.

In Step S 43, the determination of the error matrix gain, which is executed in Step S 33 of the basic process, is conducted by expressing the error matrix gain in the form of the formula (16) and determining the design parameters $\Gamma(k)$ and $\Gamma(k)$ in such a manner as to satisfy the condition of the formula (20), taking into account the purpose of use of the system and the characteristics of the system. Steps S 44 onwards also are conducted in accordance with the practical forms expressed by the formulae (17) and (18).

The formulae (17) to (20) also affords a large degree of freedom of selection of the design parameters $\lambda(k)$ and $\Lambda(k)$ and, hence, have large flexibility, thus enabling a parameter adjustment to be conducted in a manner suitable for the objective adaptive system.

A description will now be given of an embodiment in which the error matrix gain $e(k)$ is determined as the product of a unit matrix and a scalar.

Representing the scalar by $\gamma(k)$, the error matrix gain is expressed by the following formula (22).

$$\Gamma_e(k) = \gamma(k)\, I \qquad (22)$$

The following formulae are obtained corresponding to the formulae (8) and (9), by using the condition of the formula (22) and by suitably setting the design parameter $\Lambda(k)$.

$$\theta(k) = \theta(k-1) - \gamma(k)\,\Gamma(k-1)\,Z(k)\,e(k) \qquad (23)$$

$$\Gamma(k) = (1/\lambda(k))\,[\Gamma(k-1) - \gamma(k)\,\Gamma(k-1)\,Z(k)\,Z^T(k)\,\Gamma(k-1)] \qquad (24)$$

$$\Gamma(-1) > 0, \; \Gamma^{-1}(-1) > 0 \qquad (25)$$

$$0 < \lambda(k) \leq 1 \qquad (26)$$

$$0 < \gamma(k) < 1/\mathrm{tr}\,[Z^T(k)\,\Gamma(k-1)\,Z(k)] \qquad (27)$$

These formulae do not necessitate computation of inverse matrix, though the signal gain $\Gamma(k)$ is varied as the time elapses. In addition, these formulae provide excellent converging characteristics. The formula (23) determines the vector parameter $\theta(k)$, while the formula (24) determines the signal matrix gain $\Gamma(k)$. The formula (25) determines the initial condition for the signal matrix gain $\Gamma(k)$. The formulae (26) and (27) determine $\lambda(k)$ and $\gamma(k)$ Thus, $\lambda(k)$ and $\gamma(k)$ themselves can be regarded as being design parameters. It will be thus understood that the formulae (23) to (27) also provide large flexibility to the error scalar gain $\gamma(k)$ and the signal matrix gain $\Gamma(k-1)$ so as to enable a parameter adjustment further suited to the objective adaptive system.

Figure 5:
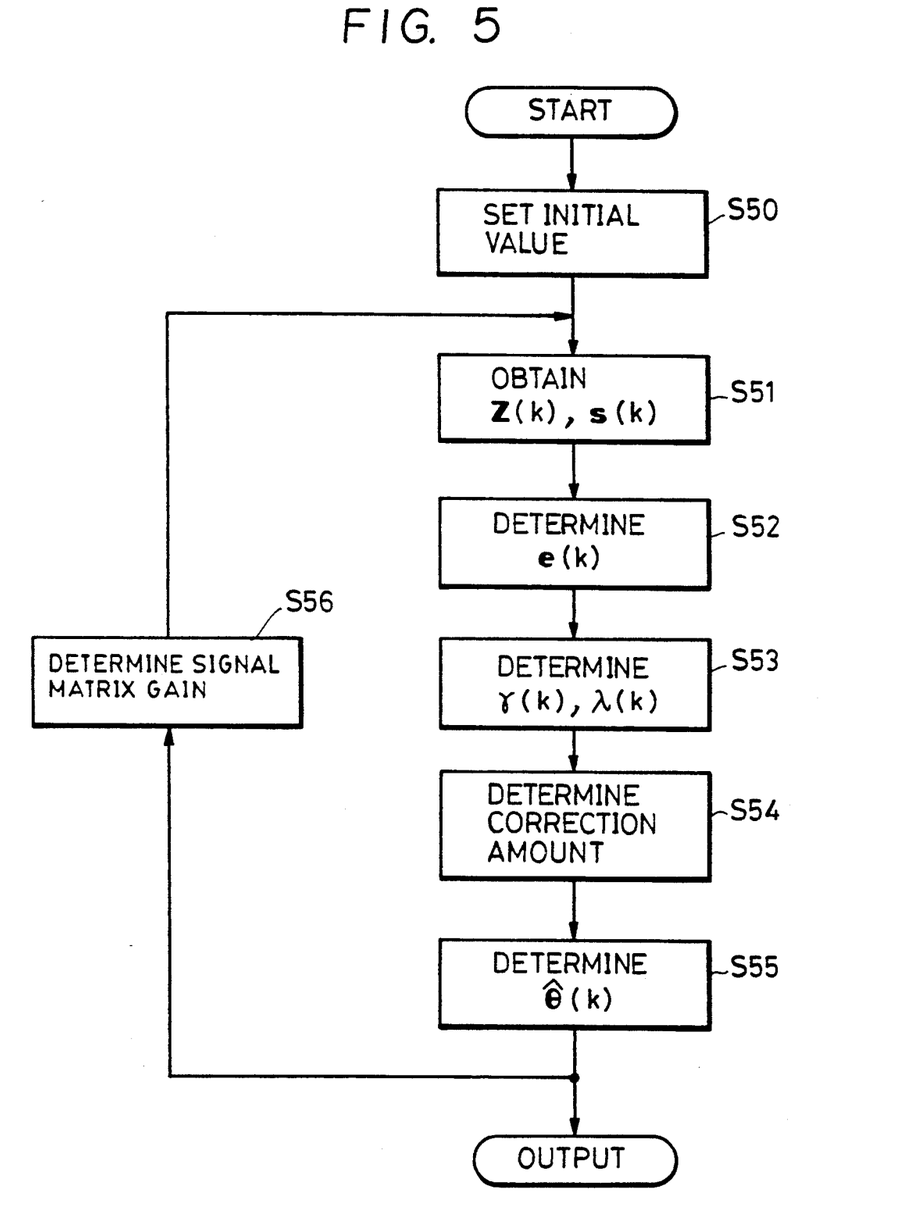

FIG. 5 shows a flow chart of a process executed in accordance with the formulae (23) to (27).

Steps S 50 to S 56 are practical forms of the basic processing operation executed in Steps S 30 to S 36 of the process explained before in connection with FIG. 3.

In Step S 53, the determination of the error matrix gain, which is executed in Step S 33 of the basic process, is conducted by expressing the error matrix gain in the form of the formula (22) and determining the parameters $\lambda(k)$ and $\gamma(k)$ in such a manner as to satisfy the conditions of the formulae (26) and (27), taking into account the purpose of use of the system and the characteristics of the system. Steps S 54 onwards also are conducted in accordance with the practical forms expressed by the formulae (23) and (24).

A description will now be given of an embodiment in which the signal matrix gain $\Gamma(k)$ is fixed.

Representing the fixed signal matrix gain $\Gamma(k)$ by $\Gamma(k) = \Gamma$, the algorithms corresponding to the formulae (8) and (9) are expressed as follows.

$$\theta(k) = \theta(k-1) - \Gamma Z(k)\,\Gamma_e(k)\,e(k) \qquad (28)$$

$$\Gamma(-1) > \Gamma^{-1}(-1) > 0 \qquad (29)$$

$$0 < \Gamma_e(k) < 2\,Z(^T(k)\,\Gamma Z(k))^{-1} \qquad (30)$$

The formula (28) is a successive formula for determining the parameter $\theta(k)$, while the formula (29) expressed conditions for determining the fixed signal matrix gain. As will be seen from these formulae, the fixed signal matrix gain $\Gamma$ only needs to be a bounded positive definite matrix and, hence, exhibits a sufficiently large flexibility. The formula (30) poses condition for the selection of the error matrix gain $\Gamma_e(K)$. It needs only to satisfy the condition of the formula (30) for the purpose of securing the conditions of the formulae (3) to (6). Thus, a large flexibility is obtained also in this respect. It is also possible to determine the error matrix gain $\Gamma_e(k)$ in the form of a diagonal matrix, by making use of the above-mentioned flexibility.

In particular, when the error matrix gain $e(k)$ is determined as a product of a unit matrix and a scalar $\gamma(k)$ as shown by the following formula (31), it is possible to obtain processes shown by the following formulae (32) to (34).

$$\Gamma_e(k) = \gamma(k)\, I \qquad (31)$$

$$\theta(k) = \theta(k-1) - \gamma(k) \Gamma Z(k) e(k) \quad (32)$$

$$\Gamma(-1) > 0, \Gamma^{-1}(-1) > 0 \quad (33)$$

$$0 < \Gamma_e(k) < 2/\text{tr}\,[Z^T(k)\,\Gamma Z(k)]^{-1} \quad (34)$$

The algorithms of the formulae (32) to (34) do not necessitate computation of inverse matrix so that the amount of computation can remarkably decreased as compared with preceding embodiments particularly when the block size is large.

Figure 6:
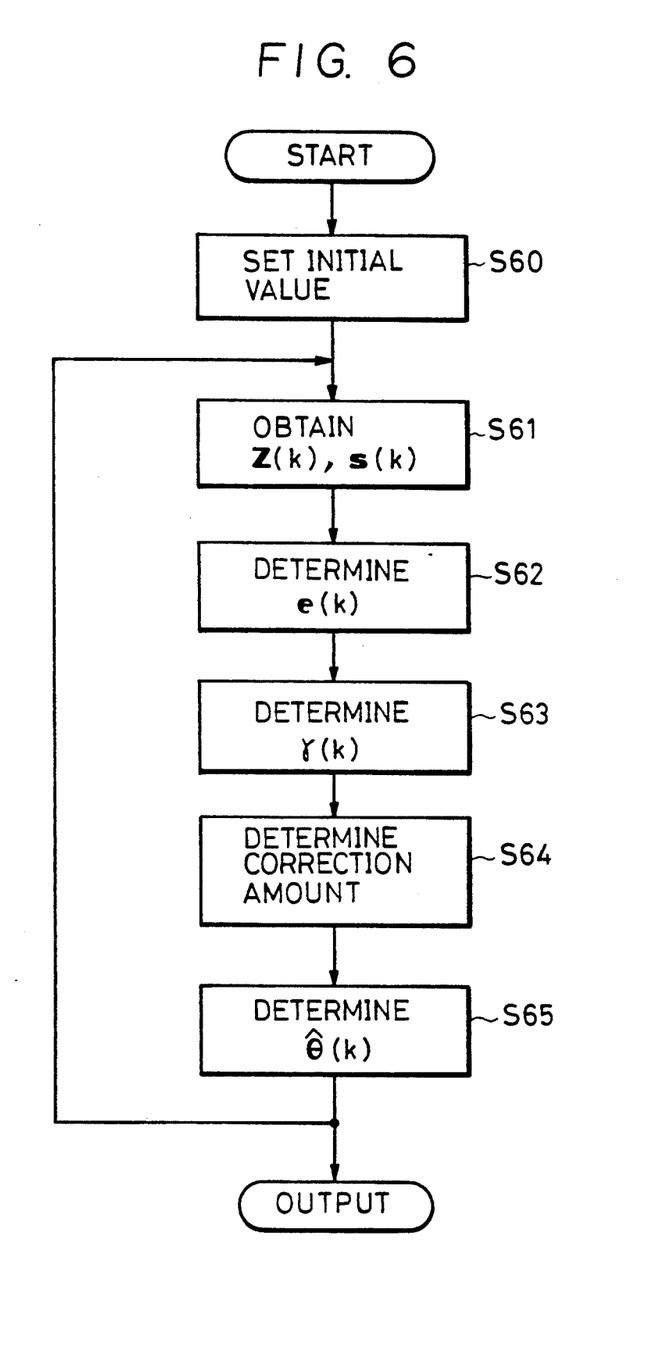

FIG. 6 shows a flow chart of a process executed in accordance with the formulae (32) to (34).

Steps S 60 to S 66 are practical forms of the basic processing operation executed in Steps S 30 to S 36 of the process explained before in connection with FIG. 3.

In Step S 63, the determination of the error matrix gain, which is executed in Step S 33 of the basic process, is conducted by expressing the error matrix gain in the form of the formula (31) and determining the parameter $\gamma(k)$ in such a manner as to satisfy the condition of the formula (34), taking into account the purpose of use of the system and the characteristics of the system. Steps S 64 onwards also are conducted in accordance with the practical forms expressed by the formulae (23) and (24). This embodiment does not employs the step for determining the signal matrix gain, because the signal matrix gain is fixed at the initial value set in Step S 60.

As will be understood from the foregoing description, the present invention offers the following advantages in adaptive adjustment of system parameter.

(1) Matrix-form adaptive gains, referred to in this specification as "signal matrix gain" and "error matrix gain", corresponding to matrix signal and vector error, are used as the adaptive gains which rule the performance of an adaptive system. It is therefore possible to conduct a parameter adjustment in a manner which is quite stable and which is optimum for the characteristics and uses of the objective adaptive system.

(2) Both the adaptive gains mentioned above have sufficiently large degrees of flexibility so that it is possible to conduct a parameter adjustment in a manner which is optimum for the characteristics and uses of the objective adaptive system.

Furthermore, the present invention also provides a system parameter adjusting method which does not at all necessitate inversion matrix computation, thereby making is possible to construct an adaptive system which can remarkably reduce the amount of computation. This feature is conveniently used particularly when the amount of computation is large. In such a case, two modes are available and can be prepared, i.e., a mode in which the signal matrix gain is varied in relation to time and a mode in which the signal matrix gain is fixed, so that the parameter adjustment can be conducted in a manner which satisfactorily meets the requirements from the characteristics and purpose of use of the adaptive system incorporating the adaptive apparatus of the invention.

What is claimed is:

1. An adaptive apparatus for adjusting a system parameter in an adaptive manner, comprising:
   input means for inputting both an input and an output signal of an adaptive processing apparatus for performing an adaptive processing of the input signal and outputting the output signal obtained through the processing;
   first signal generating means for forming a first signal in a form of a matrix from the input signal and the output signal;
   second signal generating means for forming a second signal in a form of a vector from the input signal and the output signal;
   deriving means for deriving an error signal in the form of a vector from the first signal, the second signal and a preceding estimate of the system parameter;
   first gain generating means for forming a first adaptive gain in the form of a matrix signal to adjust the error signal; and
   second gain generating means for forming a second adaptive gain in the form of a matrix signal to adjust the first signal.

2. An adaptive apparatus according to claim 1, wherein the second adaptive gain is a function employing time as a variable.

3. An adaptive apparatus according to claim 2, wherein the second adaptive gain is the inverse of an adaptive correlation matrix of the first signal.

4. An adaptive apparatus according to claim 1, wherein the second adaptive gain is a constant matrix.

5. An adaptive apparatus according to claim 1 or 4, wherein the second adaptive gain is in the form of a diagonal matrix.

6. An adaptive apparatus according to claim 1, wherein the first adaptive gain is a function employing time as a variable.

7. An adaptive apparatus according to claim 6, wherein the first adaptive gain is changed in an adaptive manner in relation to time, in accordance with the first signal and the second adaptive gain.

8. An adaptive apparatus according to claim 1 or 6, wherein the first adaptive gain is in the form of a diagonal matrix determined through a sum and product process using the first signal of the present moment, a settable scaler signal and the first adaptive gain of a preceding moment.

9. A method for adaptively adjusting a system parameter comprising the steps of:
   inputting both an input and an output signal of an adaptive processing apparatus to perform an adaptive processing of the input signal and output the output signal obtained through the processing;
   generating a first signal in a form of a matrix from the input signal and the output signal;
   generating second signal in a form of a vector from the input signal and the output signal;
   forming an error signal in the form of a vector jointly responsive to the first signal, the second signal and a preceding estimate of the system parameter;
   producing a first adaptive gain in the form of a matrix signal to adjust the error signal;
   producing a second adaptive gain in the form of a matrix signal to adjust the first signal;
   defining a new estimate of the system parameter by adjusting the preceding estimate of the system parameter on the basis of the error signal, the first adaptive gain to adjust error signal, the first signal and the second adaptive gain to adjust the second signal; and
   providing the new estimate of the system parameter to the adaptive processing apparatus.

10. The method of claim 9, wherein the second adaptive gain comprises a time varying matrix signal.

11. The method of claim 10, wherein the time varying matrix signal comprises a signal corresponding to the inverse of an adaptive correlation matrix of the first signal.

12. The method of claim 9, wherein the second adaptive gain comprises a constant matrix signal.

13. The method of claim 9 or claim 12, wherein the second adaptive gain is in the form of a diagonal matrix signal.

14. The method of claim 9, wherein the first adaptive gain is a time varying signal.

15. The method of claim 14, wherein the first adaptive gain adaptively changes in time responsive to the first signal and the second adaptive gain.

16. The method of claim 9 or claim 14, wherein the first adaptive gain is in the form of a diagonal matrix signal produced through sum and product processing of the first signal of the present moment, a settable signal, and the first adaptive gain of a preceding moment.

17. In a system having at least one system parameter for adaptively processing an input signal to form an output signal, an apparatus for adjusting at least one system parameter, said apparatus comprising:

means responsive to the input signal and the output signal for generating a first signal in a form of a matrix;

means responsive to the input signal and the output signal for generating a second signal in a form of a vector from the input signal and the output signal;

means jointly responsive to the first signal, the second signal and a preceding estimate of the system parameter for forming an error signal in the form of a vector;

means for producing a first adaptive gain in the form of a matrix signal to adjust the error signal;

means for producing a second adaptive signal gain in the form of a matrix signal to adjust the first signal; and means responsive to the error signal, the first adaptive gain to adjust the error signal, the first signal and the second adaptive gain to adjust the first signal for defining a new estimate of the system parameter.

18. In a system having at least one system parameter for adaptively processing an input signal to form an output signal, a method for adjusting the at least one system parameter, said method comprising the steps of:

generating a first signal in a form of a matrix responsive to the input signal and the output signal;

generating a second signal in a form of a vector responsive to the input signal and the output signal;

forming an error signal in the form of a vector jointly responsive to the first signal, the second signal and a preceding estimate of the system parameter;

producing a first adaptive gain in the form of a matrix signal to adjust the error signal;

producing a second adaptive gain in the form of a matrix signal to adjust the first gain signal; and defining a new estimate of the system parameter by adjusting the preceding estimate of the system parameter responsive to the error signal, the first adaptive gain to adjust the error signal, the first signal and the second adaptive gain to adjust the first signal.

* * * * *

UNITED STATES PATENT AND TRADEMARK OFFICE
CERTIFICATE OF CORRECTION

PATENT NO. : 5,216,589
DATED : June 1, 1993
INVENTOR(S) : SHINJI SHINNAKA

It is certified that error appears in the above-identified patent and that said Letters Patent is hereby corrected as shown below:

COLUMN 4

Line 49, "gain F(k-1)" should read --Γ(k-1)--.

COLUMN 6

Line 61, "follow." should read --follows.--.

COLUMN 7

Line 19, "(201)" should read --(20)--.

COLUMN 8

Line 44, "Γ(-1)>Γ⁻¹(-1)> 0(29)" should read --Γ(-1)>0, Γ⁻¹(-1)>0 (29)--.

COLUMN 9

Line 50, "is" should read --it--.

UNITED STATES PATENT AND TRADEMARK OFFICE
CERTIFICATE OF CORRECTION

PATENT NO. : 5,216,589
DATED : June 1, 1993
INVENTOR(S) : SHINJI SHINNAKA

It is certified that error appears in the above-identified patent and that said Letters Patent is hereby corrected as shown below:

<u>COLUMN 12</u>

Line 12, "ter." should read
--ter by adjusting the preceding estimate of the system parameter.--.

Signed and Sealed this

Third Day of May, 1994

*Attest:*

BRUCE LEHMAN

*Attesting Officer*  Commissioner of Patents and Trademarks